United States Patent
Fath et al.

(10) Patent No.: US 6,846,984 B2
(45) Date of Patent: Jan. 25, 2005

(54) SOLAR CELL AND METHOD FOR MAKING A SOLAR CELL

(75) Inventors: Peter Fath, Constance (DE); Wolfgang Jooss, Constance (DE)

(73) Assignee: Universitat Konstanz, Constance (DE)

( * ) Notice: Subject to any disclaimer, the term of this patent is extended or adjusted under 35 U.S.C. 154(b) by 0 days.

(21) Appl. No.: 10/258,720

(22) PCT Filed: Apr. 21, 2001

(86) PCT No.: PCT/DE01/01542

§ 371 (c)(1),
(2), (4) Date: Oct. 25, 2002

(87) PCT Pub. No.: WO01/82383

PCT Pub. Date: Nov. 1, 2001

(65) Prior Publication Data

US 2003/0089393 A1 May 15, 2003

(30) Foreign Application Priority Data

Apr. 27, 2000 (DE) .......................................... 100 20 541

(51) Int. Cl.⁷ ..................... H01L 31/068; H01L 31/18; H01L 31/0224
(52) U.S. Cl. ........................... 136/256; 438/98; 438/68; 257/457; 257/431
(58) Field of Search .......................... 136/256; 438/98, 438/68; 257/457, 431

(56) References Cited

U.S. PATENT DOCUMENTS

| | | | |
|---|---|---|---|
| 3,278,811 A | * | 10/1966 | Mori .......................... 136/244 |
| 3,350,775 A | | 11/1967 | Iles |
| 4,361,950 A | | 12/1982 | Amick |
| 4,610,077 A | * | 9/1986 | Minahan et al. .............. 438/68 |
| 4,726,850 A | | 2/1988 | Wenham et al. |
| 4,989,059 A | | 1/1991 | Micheels et al. |
| 5,082,791 A | * | 1/1992 | Micheels et al. ............. 438/62 |
| 5,258,077 A | | 11/1993 | Shahryar |
| 5,620,904 A | | 4/1997 | Hanoka |
| 5,665,175 A | | 9/1997 | Safir |
| 6,441,297 B1 | * | 8/2002 | Keller et al. ................. 136/249 |
| 2003/0102022 A1 | * | 6/2003 | Fath et al. ................... 136/256 |

FOREIGN PATENT DOCUMENTS

| | | |
|---|---|---|
| DE | 43 11 173 A1 | 10/1993 |
| DE | DE 43 11 173 A1 | 10/1993 |
| DE | 43 33 426 C1 | 12/1994 |
| DE | DE 43 33 426 C1 | 12/1994 |
| EP | 0 567 764 A1 | 11/1993 |
| EP | EP 0 567 764 A1 | 11/1993 |
| JP | 5-75148 | 3/1993 |
| WO | WO-99/48136 A * | 9/1999 |

OTHER PUBLICATIONS

Kress et al, "Low–Cost Back Contact Silicon Solar Cells," IEEE Transactions on Electron Devices, vol. 46, No. 10, pp. 2000–2004, Oct. 1999.*

Jooss et al, "17% Back Contact Buried Contact Solar Cells,"16th European Solar Energy Conference, pp. 1124–1127, May 2000.*

Jooss et al., "Back Contact Buried Contact Solar Cells with Metallization Wrap Around Electrodes," 28th IEEE Photovoltaic Specialists Conference, pp. 176–179, Sep. 2000.*

(List continued on next page.)

Primary Examiner—Alan Diamond
(74) Attorney, Agent, or Firm—Baker & Daniels

(57) ABSTRACT

A solar cell with buried contacts in recesses (7) on a first surface (2). On a lateral face (4), a metal layer (12) is produced. The metal layer (12) extends into a lateral zone (9) of a second surface (3) opposite the first surface (2). The metal layer serves as a first electrode (14). On the second surface (3) a second electrode (15), electrically separate from the first electrode (14), is produced so that the solar cell is provided with a back connection.

16 Claims, 13 Drawing Sheets

OTHER PUBLICATIONS

Faika et al "Simplification of EWT (Emitter Wrap–Through Solar Cell Fabrication Using Al–P–Codifussion," 28th IEEE Photovoltaic Specialists Conference, pp. 260–263, Sep. 2000.*

Jooss et al., "Process and Technology Development for Back contact Silicon Solar Cells," 29th IEEE Photovoltaic Specialists Conference, pp. 122–125, May 2002.*

Van Kerschaver et al. "A novel silicon solar cell structure . . . " pp. 1479–1482, 2nd Word Conference on Photovoltaic Solar Energy Conversion, Jul. 1998.

Schonecker et al. "Attacking limiting factors . . . " pp. 1677–1680, 2nd World Conference on Photovoltaic Solar Energy Conversion, Jul. 1998.

Thorp "A low–temperature deposited silicon . . . " pp.1535–1538, 2nd World Conference on Photovoltaic Solar Energy Conversion, Jul. 1998.

Gee et al. "Emitter wrap–through solar cell" pp. 265–270, IEEE, 1993.

Kress et al. "Low–cost back contact . . . " pp. 1547–1550, 2nd World Conference on Photovoltaic Solar Energy Conversion, Jul. 1998.

Arabito et al. "Electroless metallizations..." pp. 1558–1561, 2nd World Conference on Photovoltaic Solar Energy Conversion, Jul. 1998.

Joss et al. "17% back contact . . . " pp. 1124–1127, $16^{th}$ European Photovoltaic Solar Energy Conference, May 2000.

Yuwen et al. "Burried–contact high efficiency . . . " pp. 167–172, Solar Energy Materials and Solar Cells, vol. 48, (1997).

Kuhn et al. "Multicrystalline burried–contact solar cells . . . " pp. 672–677, $14^{th}$ European Photovoltaic Solar Energy Conference (Jul. 1997).

* cited by examiner

SOLAR CELL AND METHOD FOR MAKING A SOLAR CELL

BACKGROUND OF THE INVENTION

This invention relates to a solar cell and to a method for making a solar cell.

In particular the invention relates to a solar cell with a semiconducting doped substrate that has a first surface, a second surface opposite the first surface, and an edge surface. An emitter layer is applied to the first surface and a number of recesses are filled with metal to form electrical conductors. The electrical conductors are contacted by a first electrode, and a metal layer is applied to the second surface as the second electrode.

U.S. Pat. No. 4,726,850 discloses a method for producing a solar cell and a solar cell with so-called "buried contacts." "Buried contacts" ordinarily means electrical conductors designed as deepened or entrenched contacts that are introduced in recesses of a first surface of a solar cell. The depth of the recesses is considerably greater than their width. Solar cells designed in accordance with this patent are usually contacted on the first surface and on a second surface located opposite the first surface. This arrangement has the drawback that in a modular circuit of a plurality of such solar cells, electrical connections have to be made between the first surface and the second surface. This arrangement is not only relatively costly to produce, but also holds considerable risks of malfunction because of damage to the electrical connections of the solar cell wiring.

U.S. Pat. No. 4,361,950 discloses a solar cell with an arrangement of conductors wherein a conductor grid is applied to a first surface. The conductor system according to this patent also has contact sections that extend from the conductor grid around an edge face of the solar cell to a second surface opposite the first surface, and which serve as an n-electrode. After costly masking and abrasive treatment to remove n-conducting layers, a metal layer serving as a p-electrode is made on the second surface in the edge region. In this solar cell, it is indeed possible for the second surface laid on the back face to make contact with the two electrodes with proper arrangement of the solar cell. This, of course, has the drawback that the conducting grid may significantly reduce the efficiency of the solar cell because of the not inconsiderable shadowing of the first surface.

The task underlying the invention is to provide an efficient method for producing a solar cell, especially with deepened or entrenched contacts, so-called "buried contacts," which contact on the back face of the solar cell.

The invention is also based on the task of describing a solar cell of the aforementioned type with contacts on the back face.

SUMMARY OF THE INVENTION

The invention comprises a method for producing a solar cell with a semiconducting doped substrate that has a first surface, a second surface opposite the first surface, and an edge face. The method comprises the following steps:

forming an emitter layer on at least regions of the first surface, the edge face, and an edge region of the second surface;

introducing longitudinal recesses on the first surface that extend between subregions of the edge face;

producing a doped layer complementary to the substrate, at least in the recesses;

producing a metal layer on the electrically conducting regions of the surfaces and of the edge face, and filling of the recesses introduced into the first surface; and producing a first electrode electrically connected to the first surface in the edge region, and a second electrode on the second surface in a region located in the edge region, with the electrodes being electrically separated from one another on the second surface.

The invention further comprises making a solar cell of the type mentioned at the outset by applying the emitter layer at least to regions of the edge face and an edge region of the second surface; applying a metal layer to the edge face that is connected electrically to the electrical conductors in the recesses introduced into the first surface and that extends into the edge region of the second surface; wherein the metal layer which serves as the second electrode extends from the edge face surrounded by the edge region with marginal spacing, and the metal layers of the first electrode and of the second electrode are electrically separated from one another on the second surface.

By treating the edge face with feasible process steps in the method according to the instant invention so that a metal layer is also formed on the edge face of the solar cell and which extends into the edge region of the second surface, and, on the second surface by feasible process steps, preparing only an intermediate region within the edge region with the metal layer serving as the second electrode, an electrical connection is made from the electrically conductive fillings of the recesses made on the first surface, which in particular are designed as deepened or entrenched contacts, so-called "buried contacts," to the second surface placed on the back with proper use of the solar cell, and electrical separation is provided between the electrodes.

In one embodiment in the method pursuant to the invention, it is desirable for the electrical separation of the electrodes to be produced by introducing insulating trenches. In this configuration, the insulating trenches are advantageously introduced by mechanical milling.

In the method pursuant to the invention in another embodiment, it is desirable for the electrical separation of the electrodes to be produced by applying strips of insulation to the second surface.

For economical implementation of the method according to the present invention, it is desirable for the emitter layer to be formed over the entire surface of the substrate and subsequently to be removed at least from the second surface.

In the method pursuant to the invention, it is desirable for a dielectric to be applied at least to the first surface. This makes possible currentless deposition of the metal layer.

In the aforementioned embodiment, it is also desirable for the dielectric to be also applied to the edge face, while the second surface remains free of dielectric, for example by adjoining the second surfaces of two substrates.

In the last mentioned embodiment, it is desirable, on the one hand, for the dielectric to be removed from the edge face together with the emitter layer before applying the metal layer. In this way the metal layer can be applied directly to the edge face.

On the other hand, in the last mentioned embodiment, to avoid abrading the dielectric and emitter layer from the edge face, it is desirable to activate the dielectric applied to the edge face before developing the metal layer for currentless metal deposition.

It is also advantageous in the method pursuant to the invention for the doped layer complementary to the substrate to be produced on all regions of the first surface, of the second surface, and of the edge face that are free of dielectric. This makes costly masking unnecessary. This reduces abrading work since a region of the doped layer complementary to the substrate is present in the edge region.

In the method pursuant to the invention it is also desirable to produce a doped layer corresponding to the substrate on the second surface in the region within the edge region between the substrate and the flat-surfaced second electrode. This produces good contact.

In a modification of the last mentioned embodiment, it is desirable in the method pursuant to the invention, to avoid another process step, to introduce recesses into the second surface and to fill the recesses introduced into the second surface with metal, especially of the metal layer, to produce the second electrode.

In the solar cell according to the instant invention, it is desirable that there be a region of a doped layer complementary to the substrate in the edge region.

In the solar cell according to the instant invention, one embodiment advantageously provides that insulating trenches are produced on the inside of the edge region, reaching into the substrate, for electrical separation of the electrodes. This produces especially good electrical separation of the electrodes.

In another embodiment of the solar cell according to the instant invention, it is desirable to provide that insulating strips are applied to the second surface on the inside of the edge region for the electrical separation of the electrodes. This makes it possible to achieve electrical separation without machine cutting steps.

BRIEF DESCRIPTION OF THE DRAWINGS

The above-mentioned and other features and advantages of this invention, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DESCRIPTION OF THE PREFERRED EMBODIMENT

Figure 1:
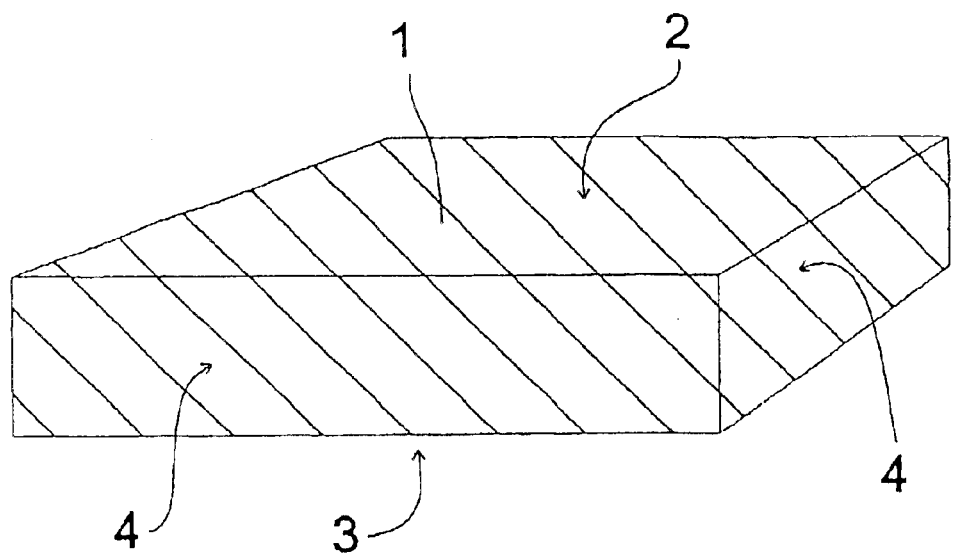
FIG. 1 is a partial cutaway perspective view of a first embodiment of the invention showing a substrate.

FIG. 1 is a partial cutaway perspective view of a first embodiment of the invention and shows a semiconducting doped substrate 1 of a solar cell to be made from a p-doped silicon material. In this embodiment the substrate 1 is produced as a flattened cuboid and has a structurally textured first surface 2, a second surface 3 opposite the first surface 2, and an encircling edge face 4 that is formed of four subsurfaces.

Figure 2:
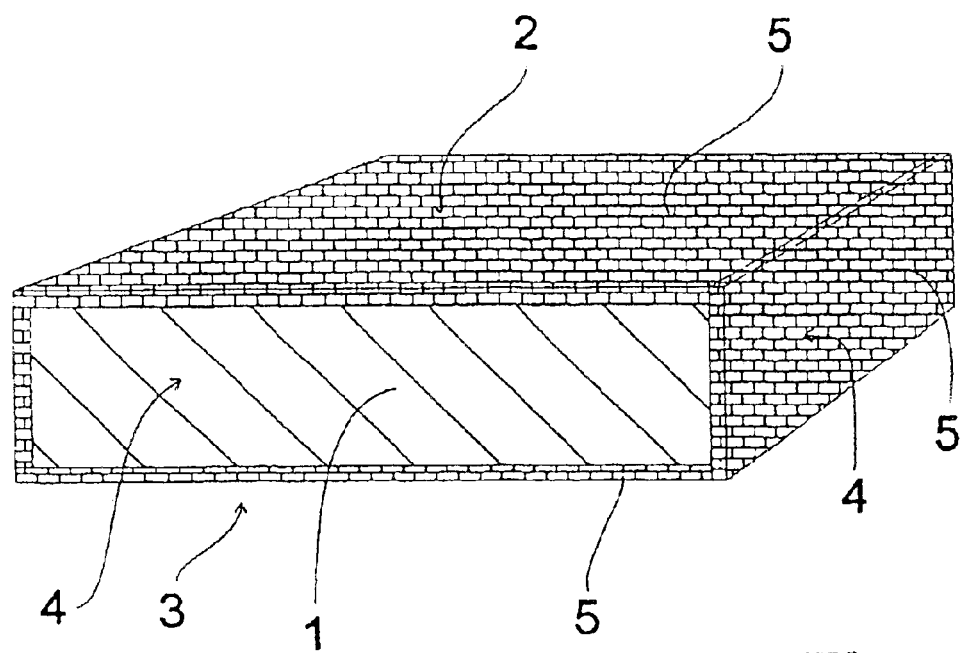
FIG. 2 is a partial cutaway perspective view of the substrate of FIG. 1 wherein an emitter layer has been applied to several surfaces.

FIG. 2, in a partial cutaway perspective view, shows the substrate 1 of the solar cell according to FIG. 1 to be produced, in which an n-doped emitter layer 5 has been produced on the surfaces 2 and 3 and on the edge face 4, for example by gas phase diffusion using liquid phosphoric acid ($POCl_3$).

Figure 3:
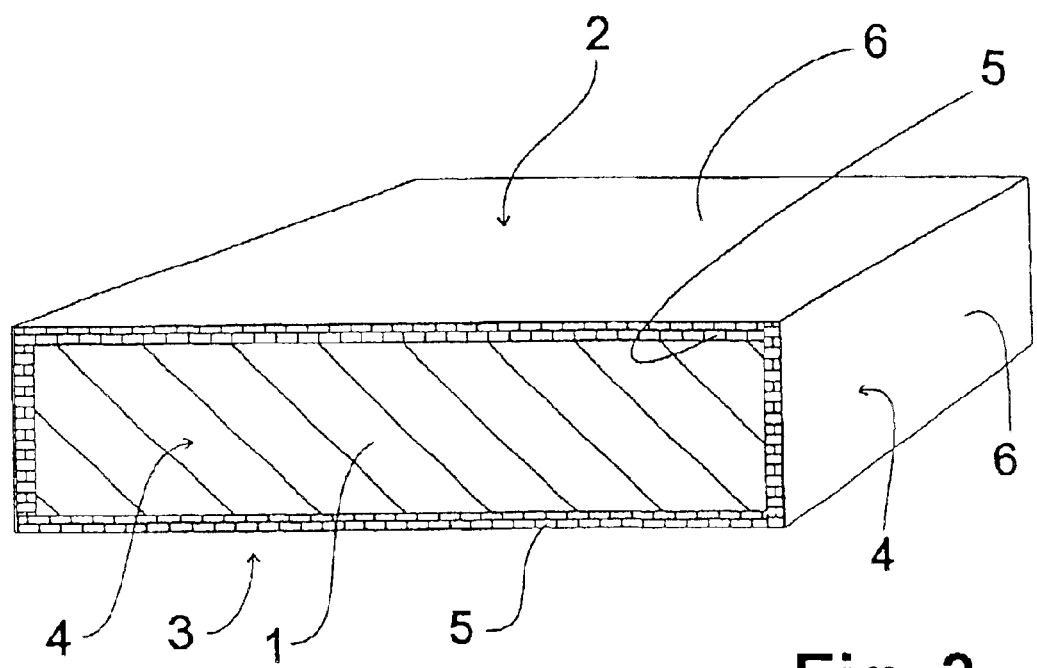
FIG. 3 is a partial cutaway perspective view of the substrate according to FIG. 2 in which a dielectric has been applied.

FIG. 3, in a partial cutaway perspective view, shows the substrate according to FIG. 2, in which a dielectric 6 has been applied in a reactor, with an arrangement of substrates 2 adjoining one another with their second surfaces 3, to the regions of the emitter layer 5 formed on the first surface 2 and the edge face 4, for example by deposition of silicon nitride (SiN) from the gas phase at low pressure (low pressure chemical vapor deposition, LPCVD).

Figure 4:
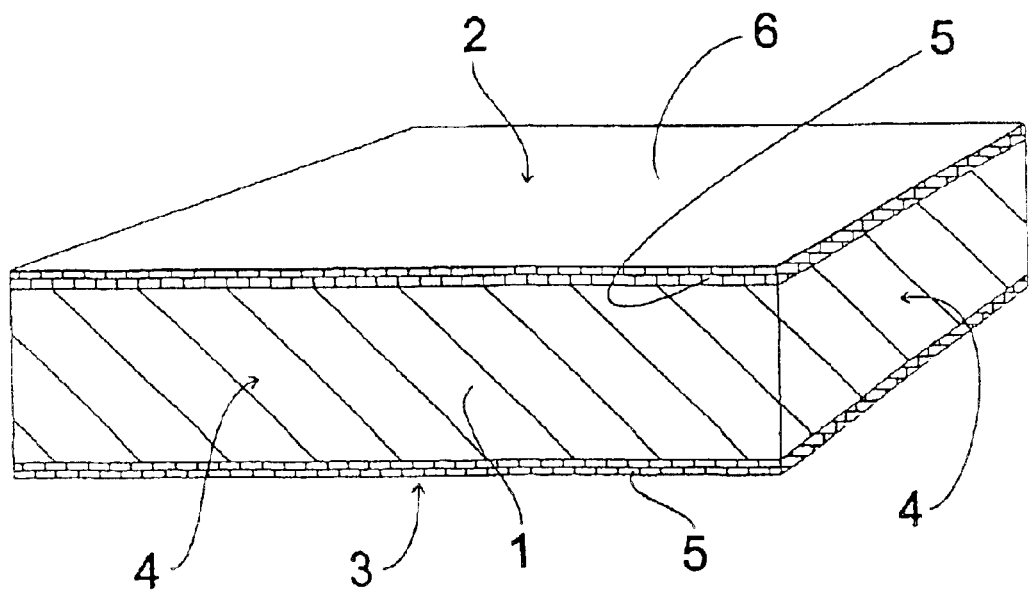
FIG. 4 is a partial cutaway perspective view of the substrate of FIG. 3 in which the dielectric and emitter layers have been removed from the edge face.

FIG. 4, in a partial cutaway perspective view, shows the substrate 1 according to FIG. 3 in which the dielectric 6 and the corresponding region of the emitter layer 5 have been removed at the edge face 4, for example by plasma etching a stack of substrates 1 adjoining one another with their surfaces 2, 3 opposite one another.

Figure 5:
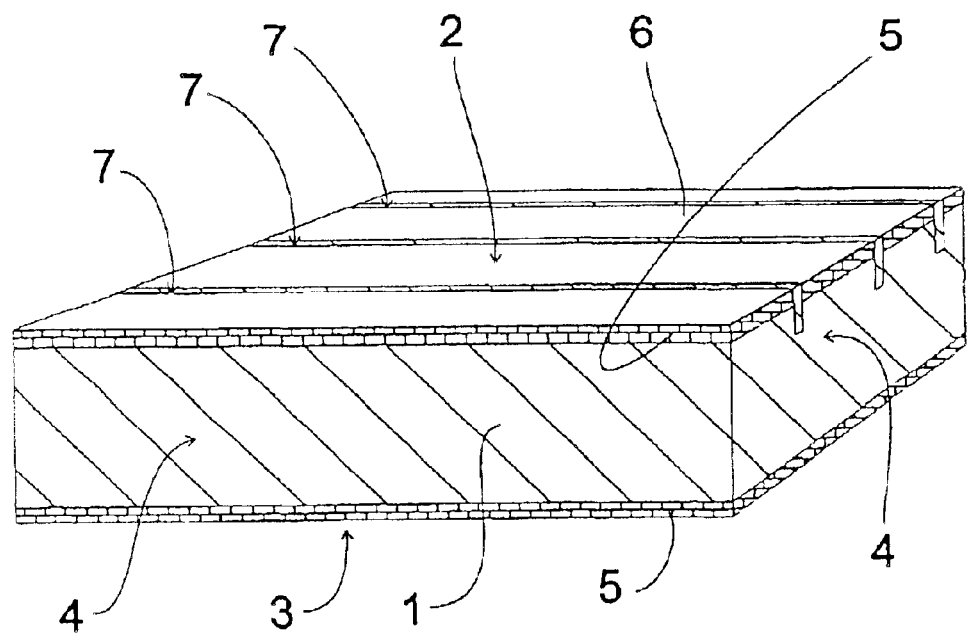
FIG. 5 is a partial cutaway perspective view of the substrate of FIG. 4 in which contact trenches have been introduced.

FIG. 5, in a partial cutaway perspective view, shows the substrate 1 according to FIG. 4 in which a plurality of contact trenches 7 have been introduced into the first surface 2 as longitudinal recesses, for example by mechanical milling or by vaporization based on the action of at least one laser beam. The contact trenches 7 run essentially parallel to one another between two opposite subsurfaces of the edge face 4 and are designed for so-called "buried contacts" with a depth larger by a multiple than their width.

Figure 6:
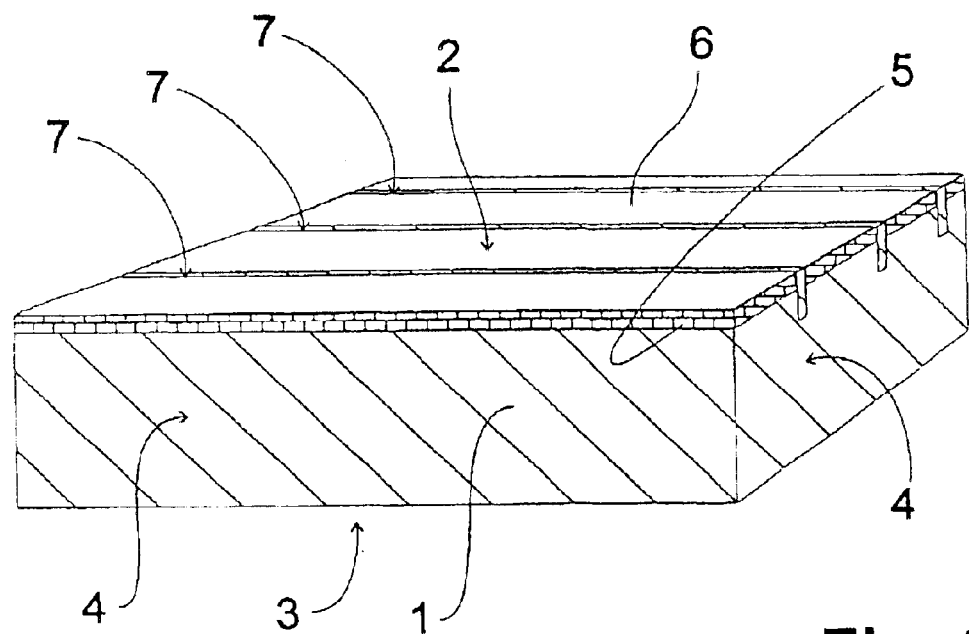
FIG. 6 is a partial cutaway perspective view of the substrate of FIG. 5 in which portions of an emitter layer have been removed.

FIG. 6, in a partial cutaway perspective view, shows the substrate 1 according to FIG. 5, after saw damage to the contact trenches 7 has been smoothed by etching, for example in hot sodium hydroxide solution (NaOH), and after the corresponding regions of the emitter layer 5 on the second surface 3 have been removed.

Figure 7:
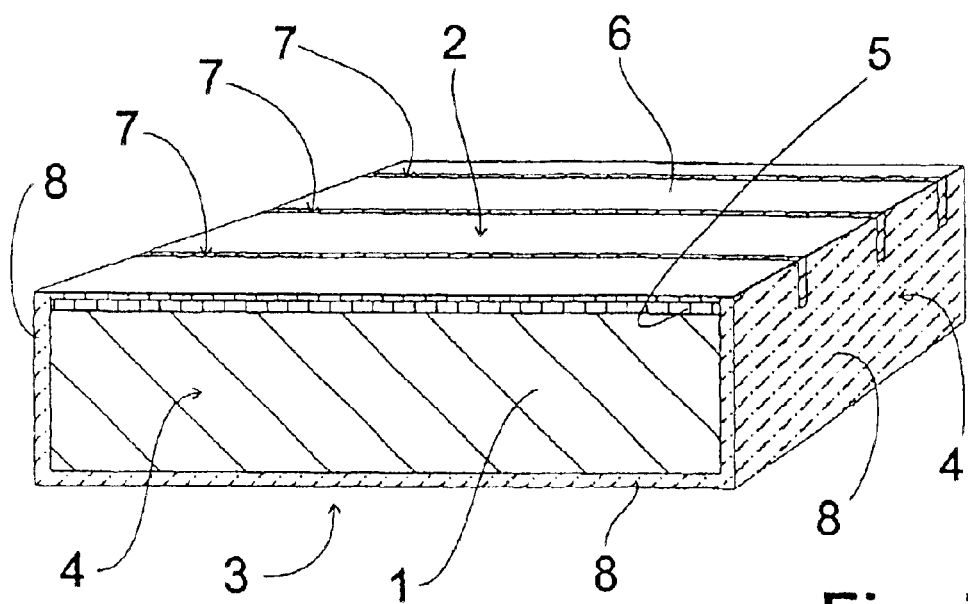
FIG. 7 is a partial cutaway perspective view of the substrate of FIG. 6 in which a phosphorous doped layer has been applied.

FIG. 7, in a partial cutaway perspective view, shows the substrate 1 according to FIG. 6 in which a phosphorus-doped layer 8 has been produced as a negatively doped n-conducting layer on the second surface 3, the edge face 4, and in the contact trenches 7, by strong phosphorus diffusion using phosphoric acid.

Figure 8:
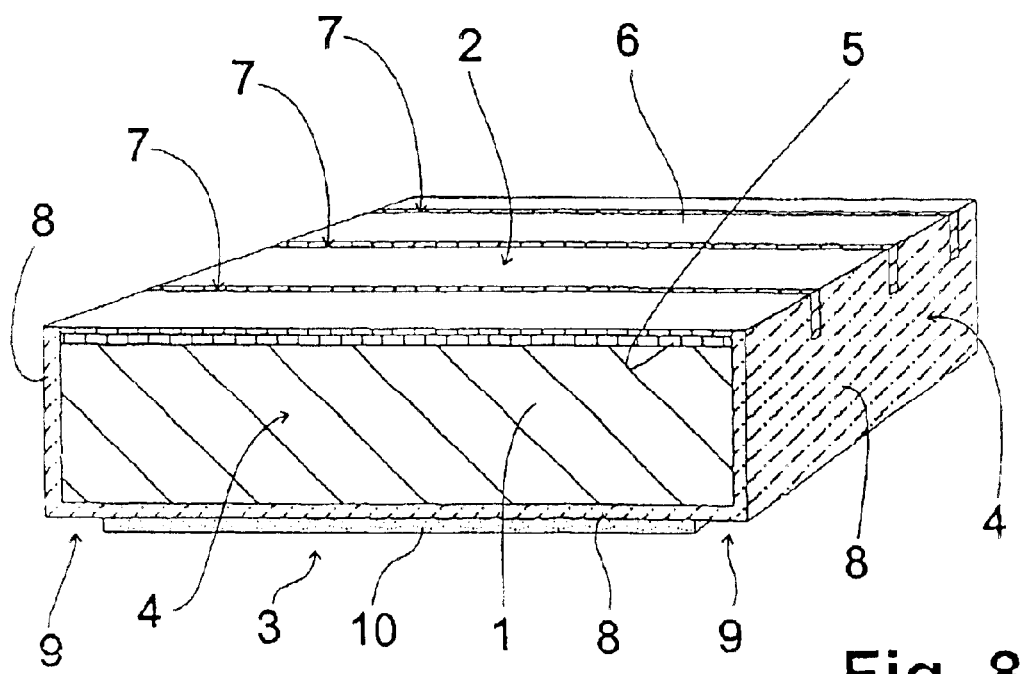
FIG. 8 is a partial cutaway perspective view of the substrate of FIG. 7 in which an aluminum layer has been applied.

FIG. 8, in a partial cutaway perspective view, shows the substrate according to FIG. 7 in which an aluminum layer 10 has been applied to the second surface 3 on the phosphorus-doped layer 8 with marginal spacing from the two opposite subsurfaces of the edge face 4 into which the contact trenches 7 open, for example by electron beam vaporization, by sputtering, or by other techniques. In this procedure an edge region 9 left free on the second surface 3 and the edge face 4 were masked.

Figure 9:
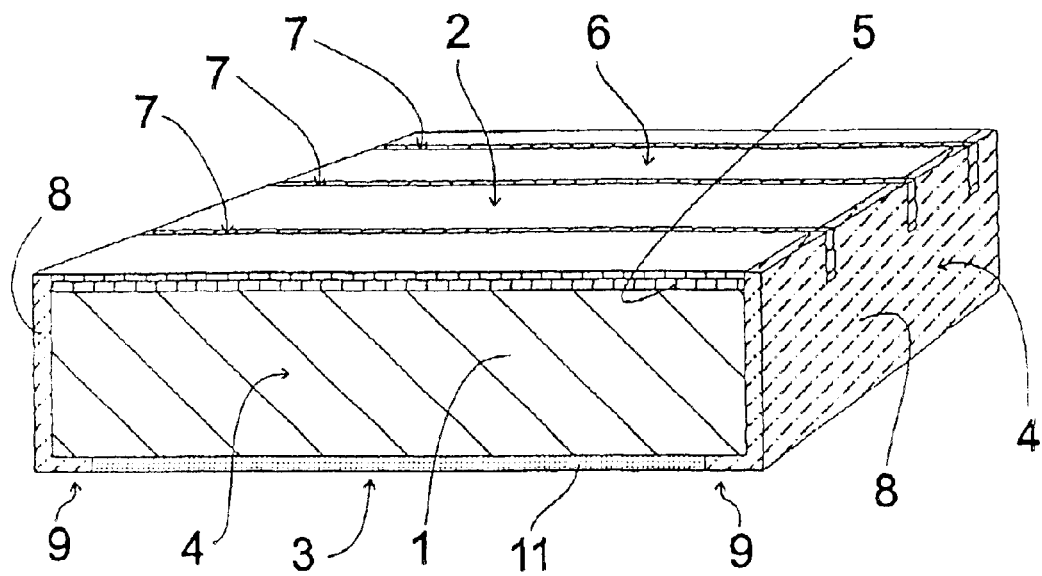
FIG. 9 is a partial cutaway perspective view of the substrate of FIG. 8 in which the aluminum layer has been alloyed to form an aluminum doped layer.

FIG. 9, in a partial cutaway perspective view, shows the substrate 1 according to FIG. 8 after the aluminum of the aluminum layer 10 has been alloyed into the second surface 3 to form an aluminum-doped layer 11 as a positively doped p-conducting layer to overcompensate for the underlying regions of the phosphorus-doped layer 8 and to form a so-called "back surface field" intended as an electrode region. The phosphorus-doped layer 8 present in the edge region 9 of the second surface 3 then directly borders the aluminum-doped layer 11 on the second surface 3.

Figure 10:
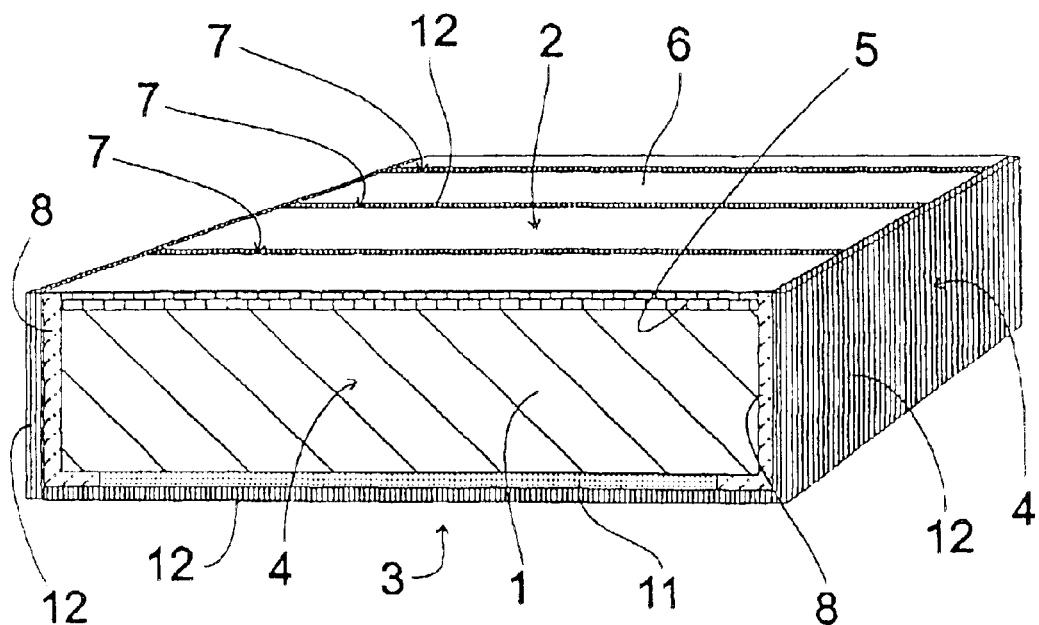
FIG. 10 is a partial cutaway perspective view of the substrate of FIG. 9 after the application of a layer of nickel.

FIG. 10, in a partial cutaway perspective view, shows the substrate 1 according to FIG. 9 after a metal layer 12 of nickel (Ni) has been applied by selective currentless metal deposition in an ionic bath for electrical contacting, and after sintering of contacts on the second surface 3 further layers of copper (Cu) and Silver (Ag) have been applied for corrosion protection to the regions of the first surface 2, of the second surface 3, and of the edge face 4 that are free of dielectric 6. In this procedure the contact trenches 7 are filled and are brought into electrical connection with the second surface 3 through the edge face 4 coated with the metal layer 12.

Figure 11:
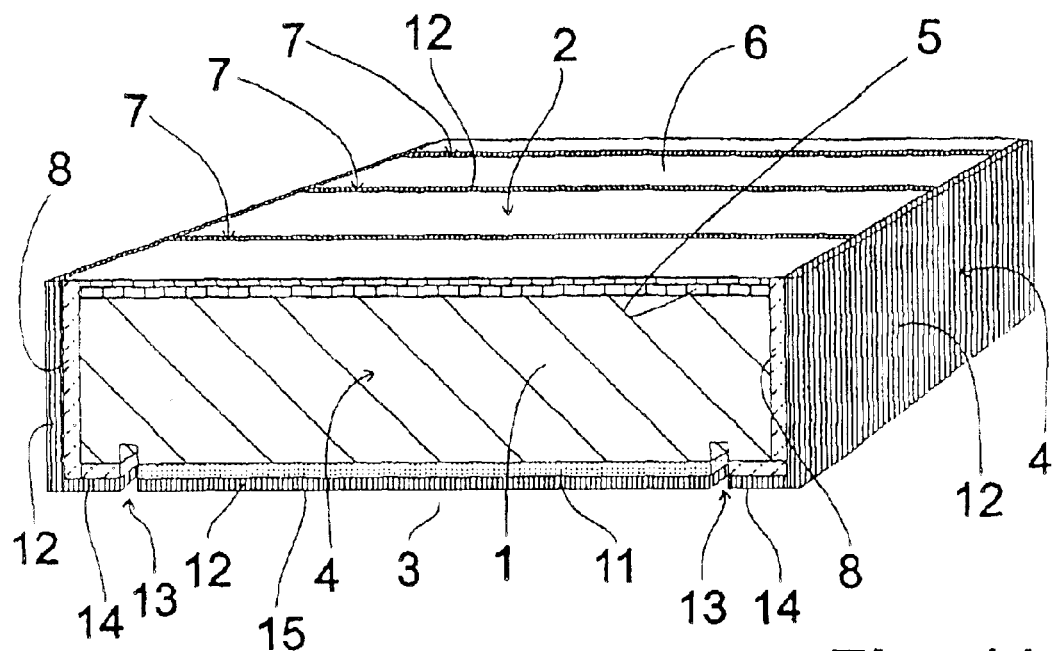
FIG. 11 is a partial cutaway perspective view of the substrate of FIG. 10 in which insulating trenches have been formed.

FIG. 11, in a partial cutaway perspective view, shows the substrate 1 according to FIG. 10 in which to complete the solar cell pursuant to the first example of embodiment, insulating trenches 13 penetrating into the substrate 1 have been introduced along the border between the phosphorus-doped layer 8 and the aluminum-doped layer 11 as electrical separators, preferably by mechanical milling to avoid melting processes, which separate the metal layer 12 on the second surface 3 into an n-electrode 14 as the first electrode and a p-electrode 15 as the second electrode. In a modification, the insulating trenches 13 are introduced into the n-doped part of the edge region 9. The n-electrode 14 in that case is electrically connected to the so-called "buried contacts" formed by filling the contact trenches 7 formed on the first contact surface 2 essentially completely with material from the metal layer 12, while the p-electrode 15 is contacted with the aluminum-doped layer 11.

Figure 12:
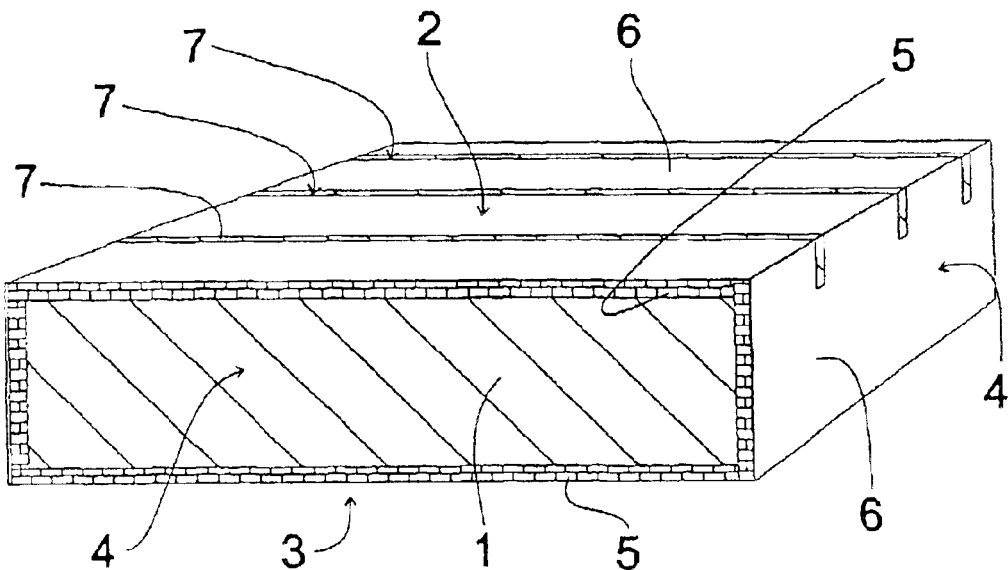
FIG. 12 is a partial cutaway perspective view of a second embodiment of the invention showing a substrate.

FIG. 12, in a partial cutaway perspective view of a second embodiment of the invention, shows a substrate 1 for a solar cell to be produced, in which the contact trenches 7 have been introduced after applying the dielectric 6 corresponding to the procedure in the first example of embodiment explained with reference to FIGS. 1 to 3. In the second embodiment, however, the regions of the emitter layer 5 and of the dielectric 6 present on the edge face 4 have been left on the edge face 4.

Figure 13:
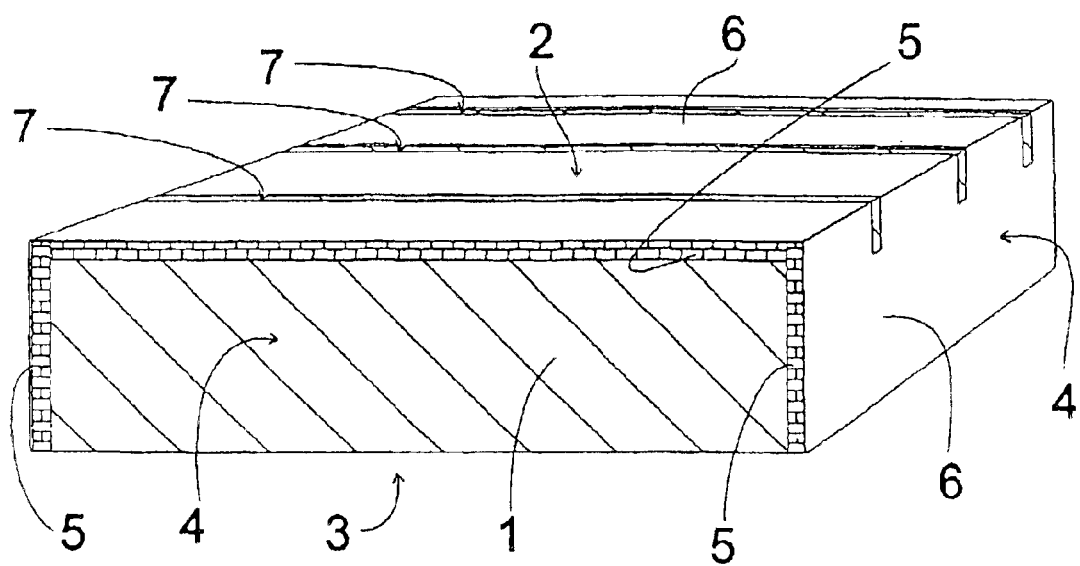
FIG. 13 is a partial cutaway perspective view of the substrate of FIG. 12 after an emitter layer has been removed from the second surface.

FIG. 13, in a partial cutaway perspective view, shows the substrate 1 according to FIG. 12 after the contact trenches 7 have been smoothed and the emitter layer 5 has been removed from the second surface 3 corresponding to the procedure shown in connection with the first embodiment and explained in connection with FIG. 6.

Figure 14:
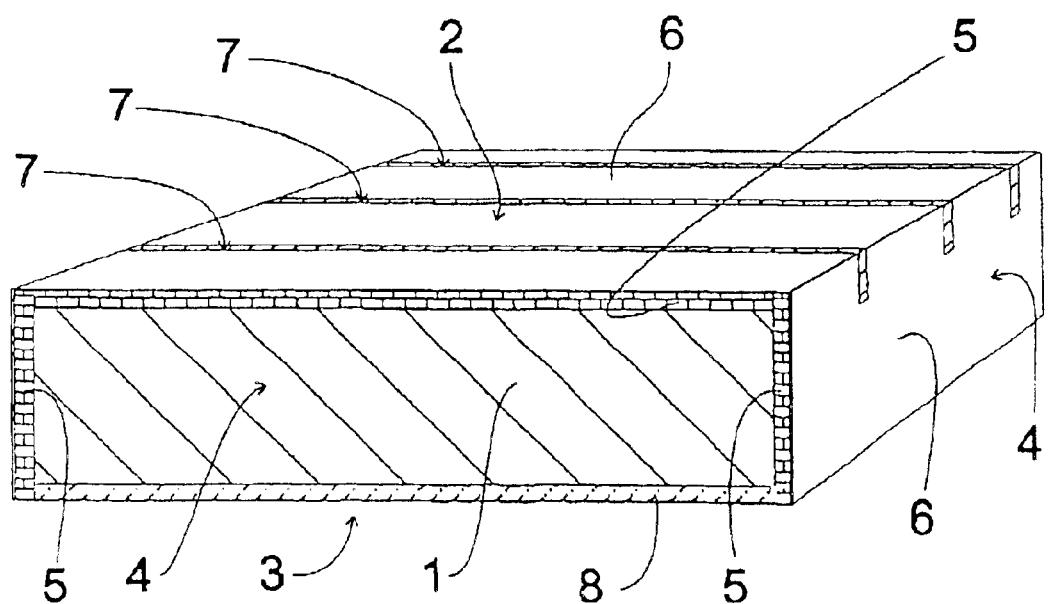
FIG. 14 is a partial cutaway perspective view of the substrate of FIG. 13 in which a phosphorous doped layer 8 has been applied.

FIG. 14, in a partial cutaway perspective view, shows the substrate 1 according to FIG. 13 in which the phosphorus-doped layer 8 has been prepared according to the first example of embodiment as explained in connection with FIG. 7, but the phosphorous doped layer is present in the second embodiment only in the contact trenches 7 and on the entire second surface 3.

Figure 15:
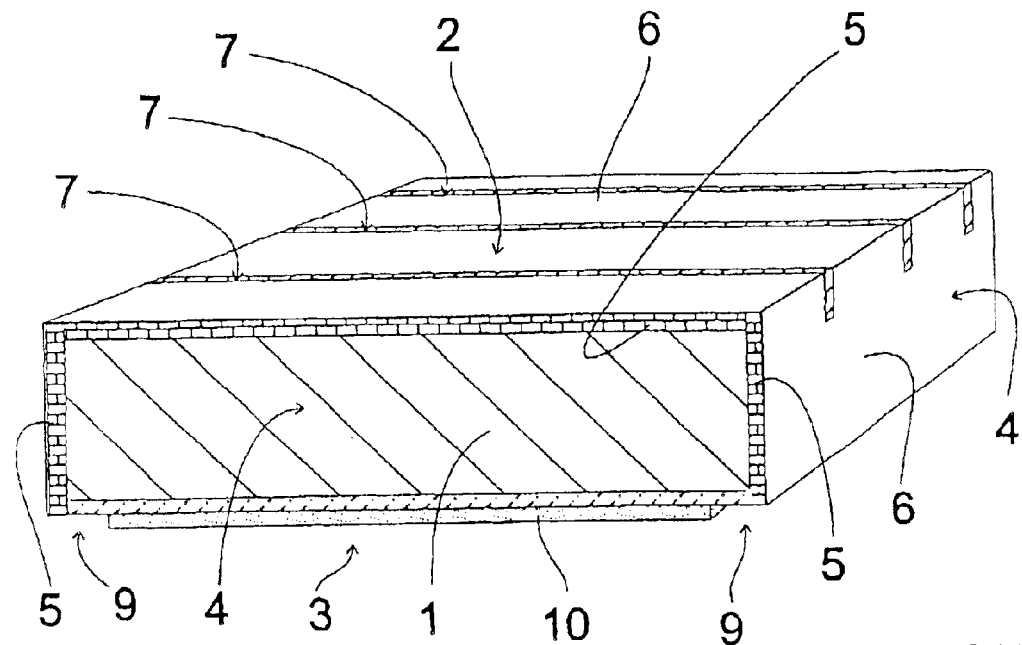
FIG. 15 is a partial cutaway perspective view of the substrate of FIG. 14 in which an aluminum layer has been applied to the second surface.

FIG. 15, in a partial cutaway perspective view, shows the substrate 1 according to FIG. 14 in which the aluminum layer 10 has been applied to the second surface 3 leaving free the edge regions 9 on the phosphorus-doped layer 8 according to the procedure shown in connection with the first embodiment and explained in connection with FIG. 8.

Figure 16:
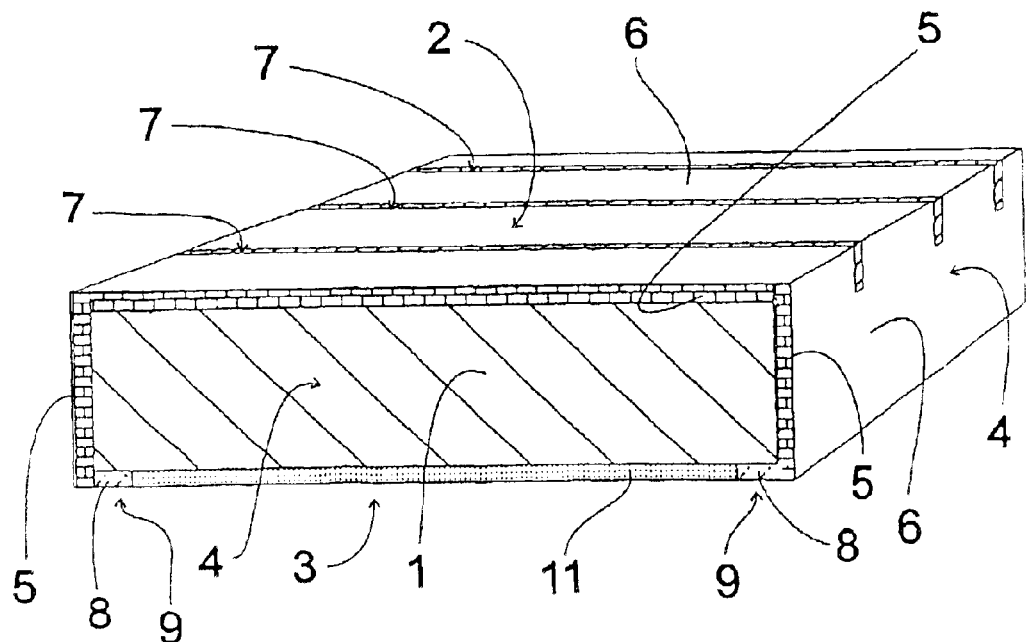
FIG. 16 is a partial cutaway perspective view of the substrate of FIG. 15 after the aluminum layer has been alloyed.

FIG. 16, in a partial cutaway perspective view, shows the substrate 1 according to FIG. 15 after alloying aluminum from the aluminum layer 10 into the phosphorus-doped layer 8 to form the aluminum-doped layer 11.

Figure 17:
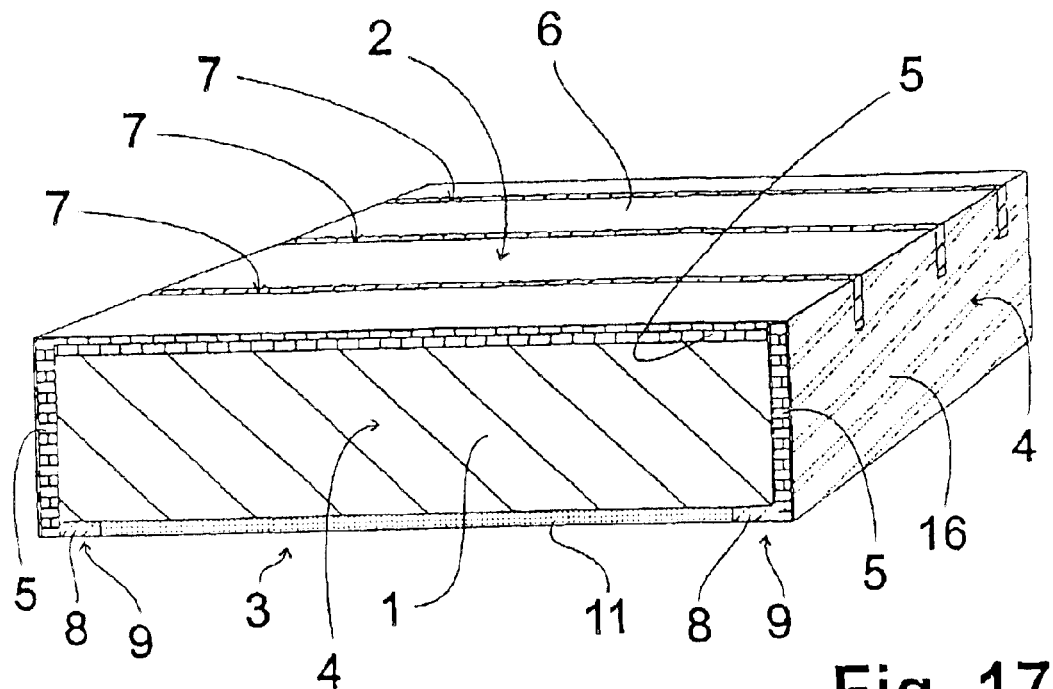
FIG. 17 is a partial cutaway perspective view of the substrate of FIG. 16 in which regions of the dielectric layer have been treated in an activator solution.

FIG. 17, in a partial cutaway perspective view, shows the substrate 1 according to FIG. 16, in which the regions of the dielectric 6 on the edge face 4 have been treated in an activator solution, for example such as $PdCl_2$, to form an activation surface 16 for the subsequent deposition of metal.

Figure 18:
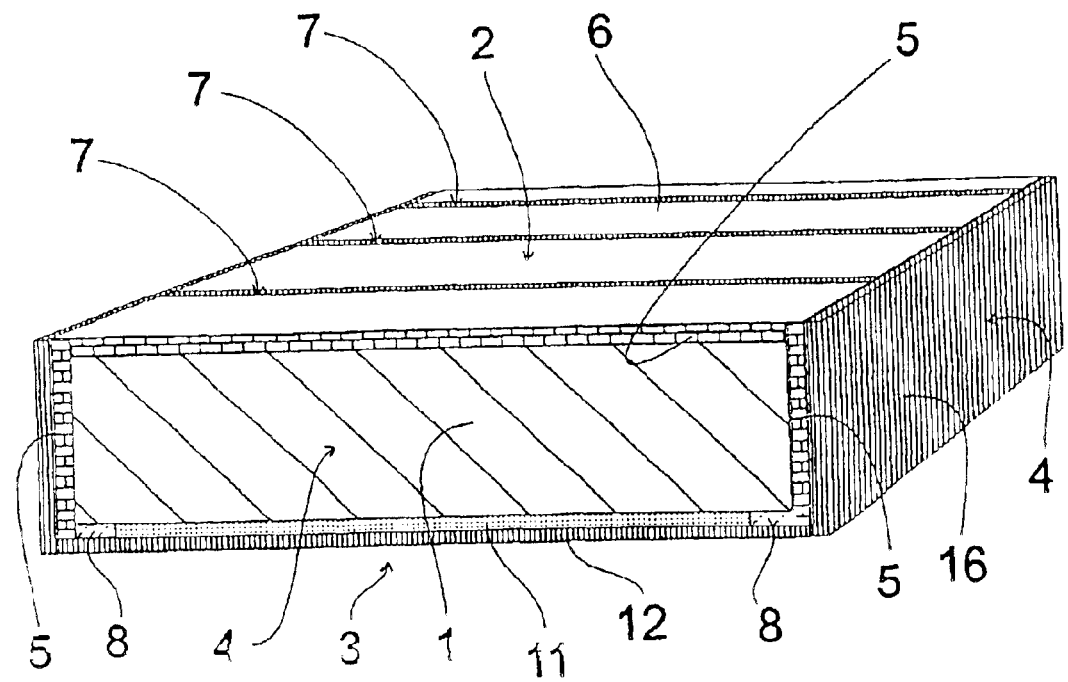
FIG. 18 is a partial cutaway perspective view of the substrate of FIG. 17 after deposition of metal thereon.

FIG. 18, in a partial cutaway perspective view, shows the substrate 1 according to FIG. 17 after the deposition of metal according to the procedure explained in the first embodiment with reference to FIG. 10. In the second embodiment, the metal layer 12 is applied at this time to the activation surface 16 which is formed by the dielectric 6 on the edge face 4.

Figure 19:
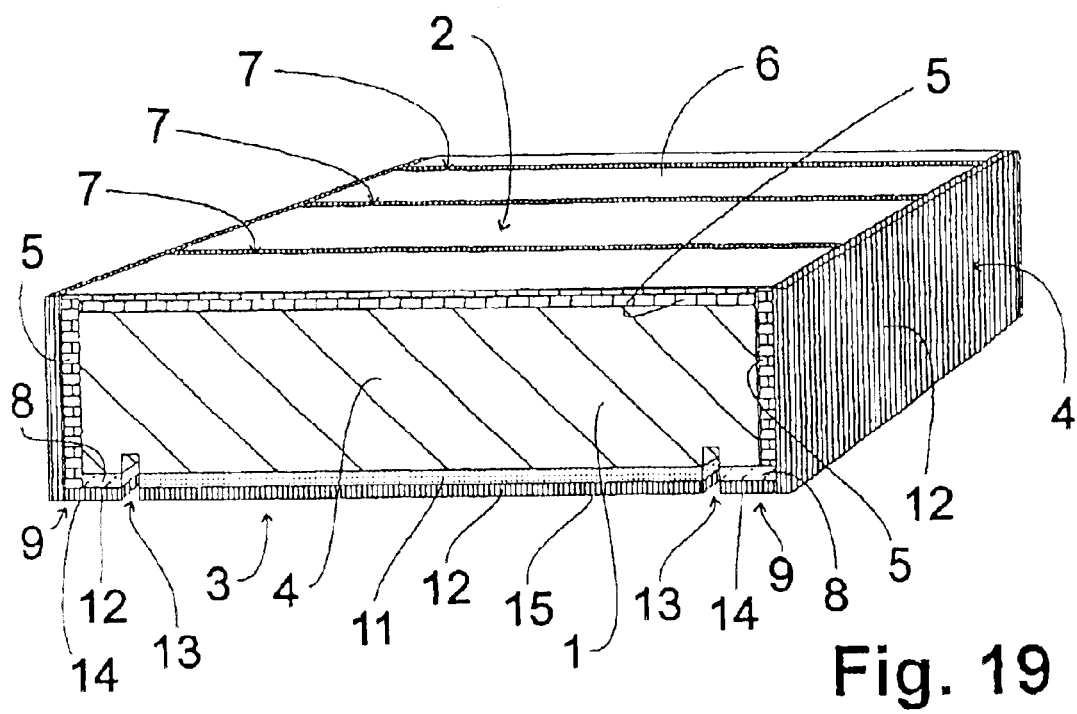
FIG. 19 is a partial cutaway perspective view of the substrate of FIG. 18 in which insulating trenches have been formed.

FIG. 19, in a partial cutaway perspective view, shows the substrate 1 according to FIG. 18 in which, to complete the solar cell pursuant to the second embodiment, the insulation trenches 13 have been introduced according to the procedure in the first embodiment explained in connection with FIG. 11, to form the n-electrode 14 and the p-electrode 15.

The second embodiment is distinguished from the first embodiment by the fact that fewer abrasive machine steps are needed on the edge face 4 than in the first embodiment.

Figure 20:
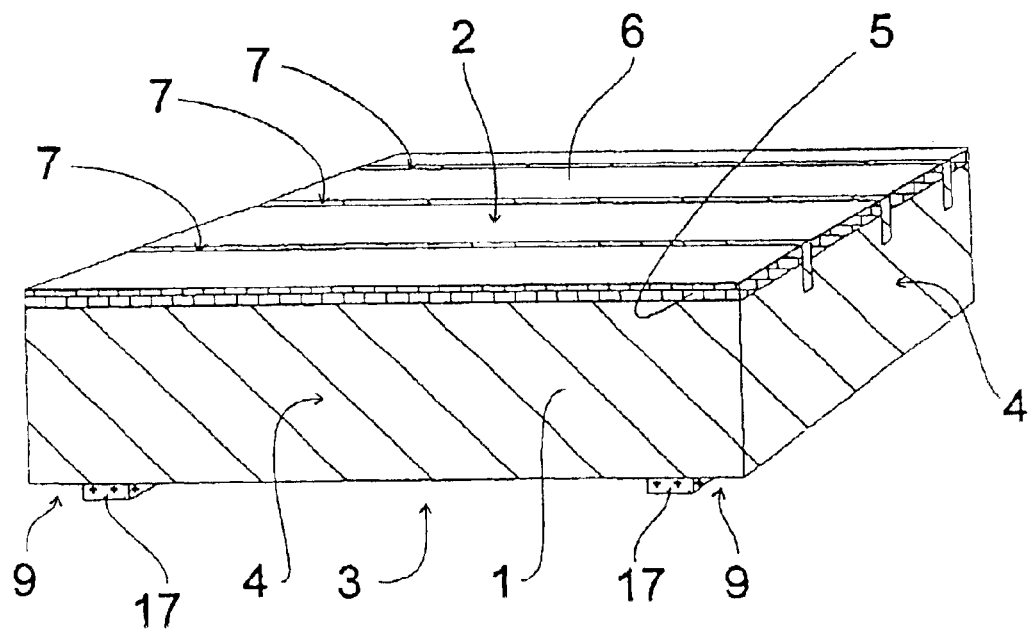
FIG. 20 is a partial cutaway perspective view of a third embodiment of the invention showing a substrate.

FIG. 20, in a partial cutaway perspective view of a third embodiment of the invention, shows a substrate 1 for a solar cell to be produced that has been treated according to the procedure in the first embodiment and as explained with reference to FIG. 1 to FIG. 6. In the third embodiment, however, insulation strips 17, for example made of $Ta_2O_5$, $TiO_2$, $SiO_2$, or SiN, have been applied, as shown in FIG. 20, along the inside of the edge region 9 to the second surface 3.

In a modification, the insulation strips 17 are alloyed into the substrate 1 as aluminum strips.

Figure 21:
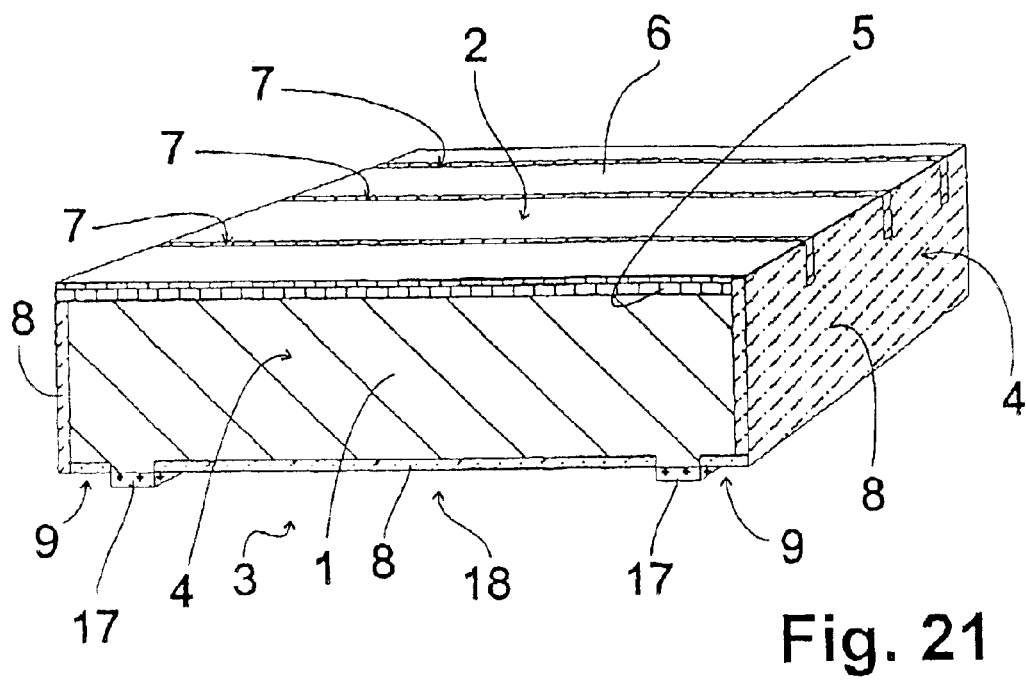
FIG. 21 is a partial cutaway perspective view of the substrate of FIG. 20 in which a phosphorous doped layer 8 has been produced.

FIG. 21, in a partial cutaway perspective view, shows the substrate 1 according to FIG. 20 in which the phosphorus-doped layer 8 has been produced by the procedure explained for the first embodiment with reference to FIG. 7. In the third embodiment, however, the insulation strips 17 shadow the underlying regions of the second surface 3, so that the phosphorus-doped layer 8 on the second surface 3 extends only into the edge regions 9 and into an intermediate region 18 between the insulation strips 17.

Figure 22:
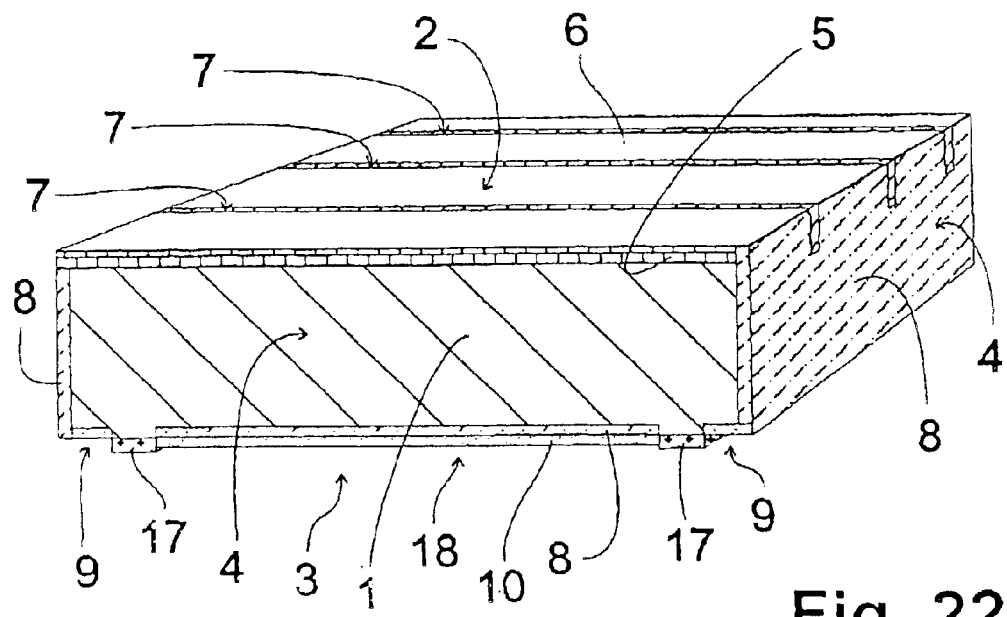
FIG. 22 is a partial cutaway perspective view of the substrate of FIG. 21 in which an aluminum layer has been applied.

FIG. 22, in a partial cutaway perspective view, shows the substrate 1 according to FIG. 21 in which the aluminum layer 10 has been applied to the intermediate region 18 by the procedure shown in connection with the first embodiment and explained with reference to FIG. 8.

Figure 23:
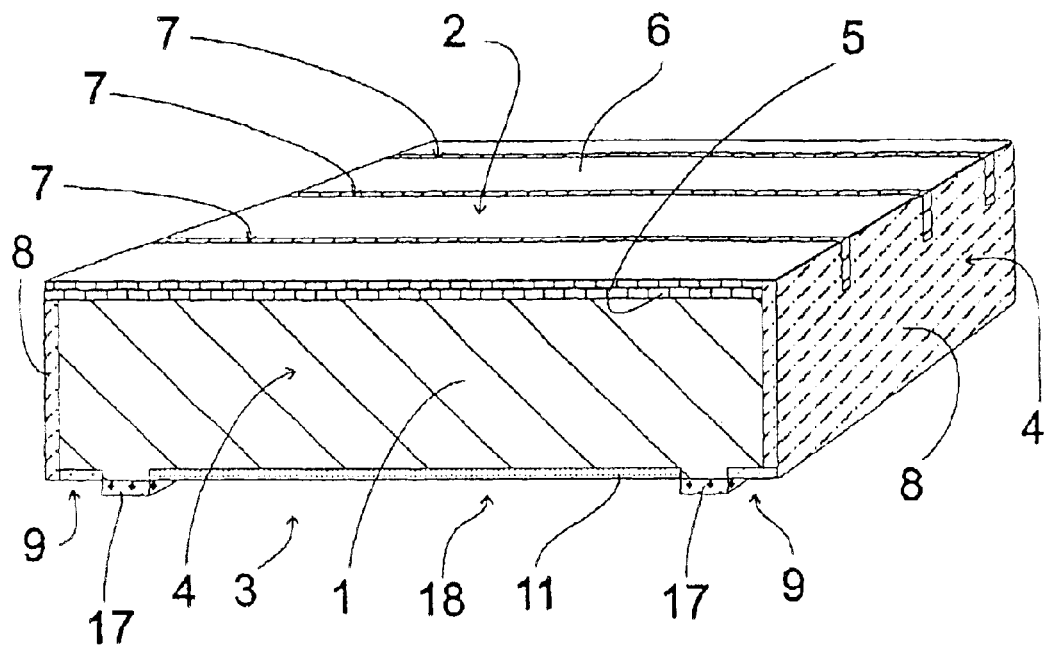
FIG. 23 is a partial cutaway perspective view of the substrate of FIG. 22 in which the aluminum layer has been alloyed.

FIG. 23, in a partial cutaway perspective view, shows the substrate 1 according to FIG. 22 in which aluminum from the aluminum layer 10 has been alloyed into the intermediate region 18 to produce the aluminum-doped layer 11, by the procedure shown in connection with the first embodiment and explained with reference to FIG. 9.

Figure 24:
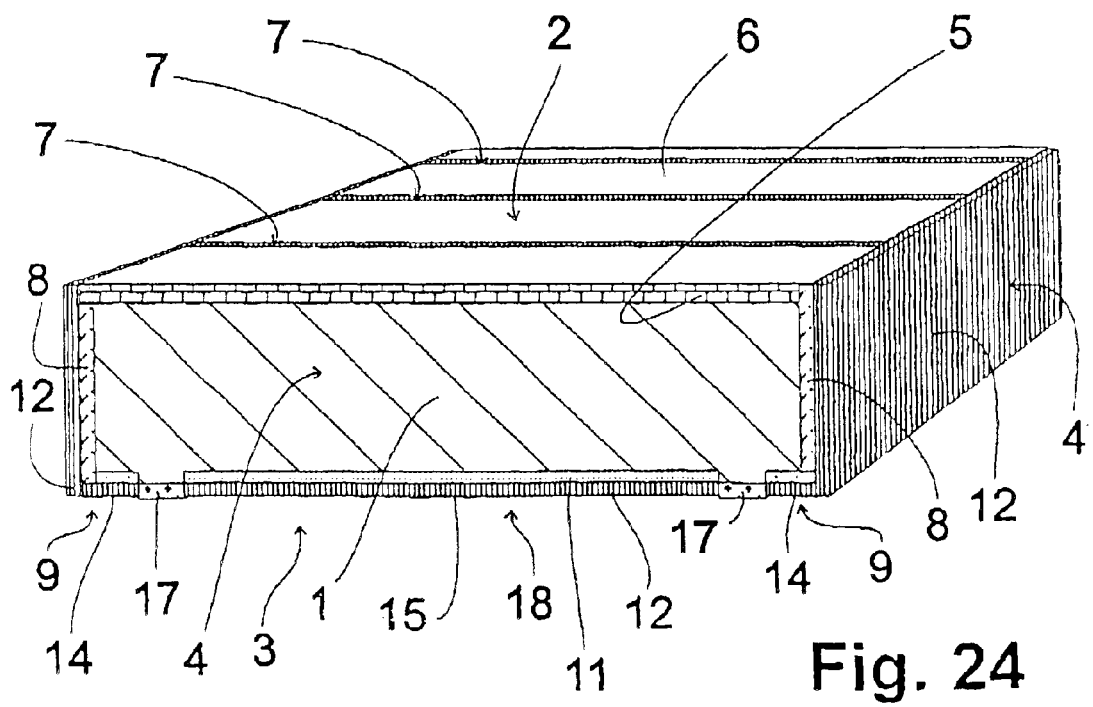
FIG. 24 is a partial cutaway perspective view of the substrate of FIG. 23 in which a metal layer has been deposited on the second surface.

FIG. 24, in a partial cutaway perspective view, shows the substrate 1 according to FIG. 23 in which the metal layer 12 has been deposited on the second surface 3 and on the edge face 4 to complete the solar cell according to the third embodiment, by the procedure shown in connection with the first embodiment and explained with reference to FIG. 10. Because of the selective deposition of metal only on electrically conductive regions and in the contact trenches 7, the insulation strips 17 remain free of metal along with the regions of the dielectric layer 6 developed on the first surface 2. In this way the n-electrode 14 that is formed in the edge regions 9, and the p-electrode 15 that is formed in the intermediate region 18, are electrically separated from one another.

The third embodiment is distinguished from the first and second embodiments by the fact that the n-electrode 14 and the p-electrode 15 are separated after the process of completing the solar cell without the necessity of cutting machining.

Figure 25:
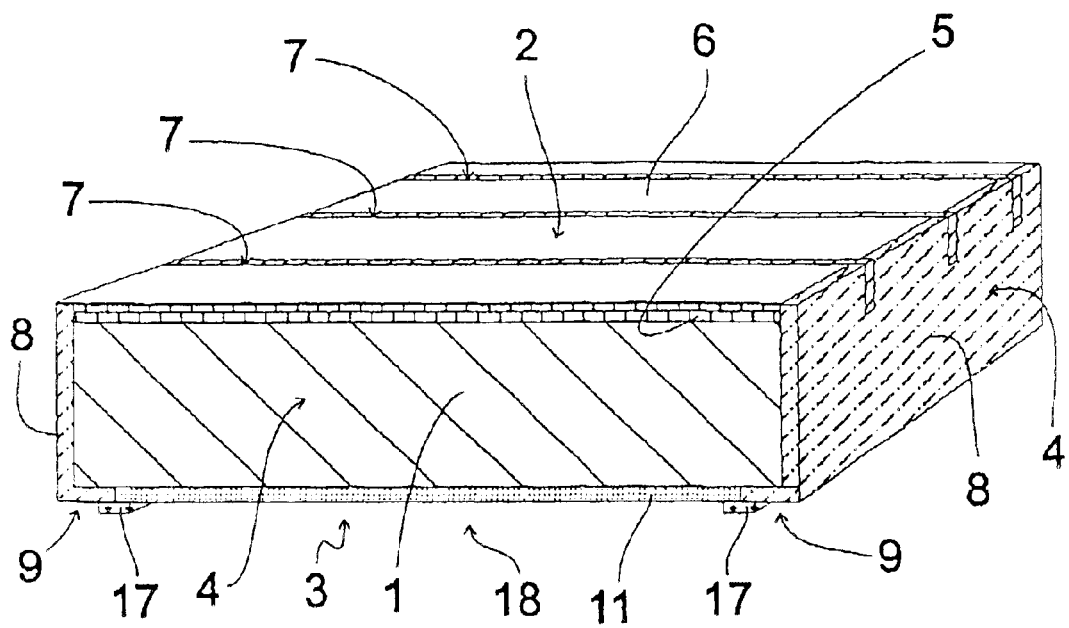
FIG. 25 is a partial cutaway perspective view of a fourth embodiment of the invention showing a substrate.

FIG. 25, in a partial cutaway perspective view of a fourth embodiment of the invention, shows a substrate 1 for a solar cell to be produced that has been treated so far according to the procedure explained in connection with the first embodiment with reference to FIG. 1 to FIG. 9. According to FIG. 25, insulation strips 17 that bound the intermediate region 18 on the second surface 3 are applied along the boundary constituting a rectifying p/n transition between the phosphorus-doped layer 8 and the aluminum-doped layer 11 by the procedure shown in connection with the third embodiment and explained with reference to FIG. 20.

Figure 26:
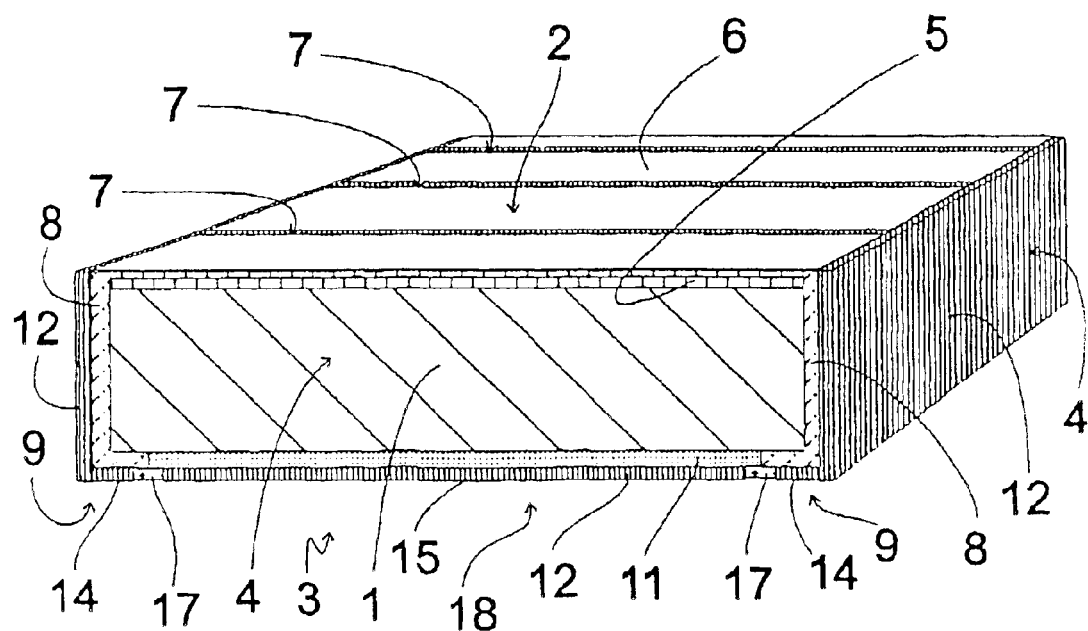
FIG. 26 is a partial cutaway perspective view of the substrate of FIG. 25 after a metal layer 12 has been applied thereto.

FIG. 26, in a partial cutaway perspective view, shows the substrate 1 according to FIG. 25 after production of the metal layer 12 by selective currentless metal deposition. Corresponding to the third embodiment, after the processes for completing the solar cell, the n-electrode 14 in the edge regions 9 and the p-electrode 15 in the intermediate region 18 are produced with electrical separation in the fourth embodiment, without the need for concluding machining to introduce insulation trenches 13 corresponding to the first embodiment and the second example of embodiment.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method for producing a solar cell with a semiconducting doped substrate (1), said substrate having a first surface (2), a second surface (3) opposite said first surface (1), and an edge face (4), said method comprising:
    forming an emitter layer (5) on at least portions of the first surface (2), the edge face (4), and an edge region (9) of the second surface (3);
    introducing a plurality of longitudinal recesses (7) in the first surface (2), said recesses extending between portions of the edge face (4);
    producing a doped layer (8), complementary to the substrate (1) in at least said recesses (7);
    applying a metal layer (12) on electrically conductive regions of the first and second surfaces (2, 3) and of the edge face (4), and thereby filling said recesses (7); and
    forming a first electrode (14) which is electrically connected to the first surface (2) by means of the edge region (9), and forming a second electrode (15) on the second surface (3) in a region (18) located adjacent said edge region (9), the electrodes (14, 15) electrically separated from one another on the second surface (3).

2. The method according to claim 1 further comprising introducing insulation trenches (13) whereby said electrodes (14, 15) are electrically separated.

3. The method according to claim 2 wherein said introducing comprises mechanical milling said insulation trenches (13).

4. The method according to claim 1 further comprising applying insulation strips (17) to the second surface (3) whereby said electrodes (14, 15) are electrically separated.

5. The method according to claim 1 wherein said emitter layer (5) is formed over the entire substrate (1) and is subsequently removed from at least the second surface (3).

6. The method according to claim 1 further comprising applying a dielectric (6) to the first surface (2).

7. The method according to claim 6 further comprising applying the dielectric (6) to said edge face (4) and keeping said second surface (3) free of dielectric (6).

8. The method according to claim 7 wherein said dielectric (6) and said emitter layer (5) are first removed from said edge face (4) before applying said metal layer (12).

9. The method according to claim 6, in which the dielectric (6) applied to the edge face (4) is activated for currentless metal deposition before applying the metal layer (12).

10. The method according to claim 6, in which the doped layer (8) complementary to the substrate (1) is formed on all portions of the first surface (2), of the second surface (3), and of the edge face (4), which are free of dielectric (6).

11. The method according to claim 1 further comprising applying a doped layer (11) corresponding to the substrate (1) on the second surface (3) in a region (18) which is located between the edge region (9) and between the substrate (1) and the second electrode (15).

12. The method according to claim 1 further comprising introducing recesses into the second surface (3) and wherein said recesses introduced into the second surface (3) are filled with metal to form the second electrode (15).

13. A solar cell comprising a semiconducting doped substrate (1) which has a first surface (2), a second surface (3) opposite the first surface (2), and an edge face (4);

an emitter layer (5) disposed on the first surface (2);

an edge region (9) located on said second surface and bounded by recesses (13) located in said second surface (3);

a plurality of second recesses (7) in said first surface, said second recesses (7) extending to two opposed edges of said first surface (2) and into said edge face (4), said second recesses (7) filled with conductive metal and thereby defining electrical conductors;

a first electrode (14) disposed on said second face (3);

a metal layer (12) on said edge face (4), said metal layer (12) electrically connected to said electrical conductors located at said two opposed edges of said second surface (2) and to said first electrode (14);

a metal layer (12) on the second surface (3) and forming a second electrode (15), the second electrode (15) surrounded by said edge region (9), the first electrode (14) and the second electrode (15) electrically separated from one another on the second surface (3) by said recesses (13).

14. Solar cell according to claim 13 further comprising a doped layer (8) complementary to the substrate (1) and located in the edge region (9).

15. Solar cell according to claim 13 wherein said recesses (13) comprise insulation trenches (13) which extend into the substrate (1) on the inside of the edge region (9) thereby electrically separating the first and second electrodes (14, 15).

16. A solar cell comprising a semiconducting doped substrate (1) which has a first surface (2), a second surface (3) opposite the first surface (2), and an edge face (4);

an emitter layer (5) disposed on the first surface (2);

an edge region (9) located on said second surface and bounded by insulation strips (17) located on said second surface (3);

a plurality of second recesses (7) in said first surface, said second recesses (7) extending to two opposed edges of said first surface (2) and into said edge face (4), said second recesses (7) filled with conductive metal and thereby defining electrical conductors;

a first electrode (14) disposed on said second face (3);

a metal layer (12) on said edge face (4), said metal layer (12) electrically connected to said electrical conductors located at said two opposed edges of said second surface (2) and to said first electrode (14);

a metal layer (12) on the second surface (3) and forming a second electrode (15), the second electrode (15) surrounded by said edge region (9), the first electrode (14) and the second electrode (15) electrically separated from one another on the second surface (3) by said insulation strips (17).

* * * * *